(12) United States Patent
Kitagawa et al.

(10) Patent No.: US 11,955,769 B2
(45) Date of Patent: Apr. 9, 2024

(54) OPTICAL ELEMENT MOUNTING PACKAGE, ELECTRONIC DEVICE, AND ELECTRONIC MODULE

(71) Applicant: KYOCERA Corporation, Kyoto (JP)

(72) Inventors: Akihiko Kitagawa, Kyoto (JP); Takashi Kimura, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 235 days.

(21) Appl. No.: 17/638,994

(22) PCT Filed: Aug. 27, 2020

(86) PCT No.: PCT/JP2020/032375
§ 371 (c)(1),
(2) Date: Feb. 28, 2022

(87) PCT Pub. No.: WO2021/039907
PCT Pub. Date: Mar. 4, 2021

(65) Prior Publication Data
US 2022/0271496 A1 Aug. 25, 2022

(30) Foreign Application Priority Data
Aug. 29, 2019 (JP) ................. 2019-156637

(51) Int. Cl.
*H01S 5/02* (2006.01)
*H01S 5/02212* (2021.01)
*H01S 5/023* (2021.01)
*H01S 5/0239* (2021.01)

(52) U.S. Cl.
CPC ........ *H01S 5/0239* (2021.01); *H01S 5/02212* (2013.01); *H01S 5/023* (2021.01)

(58) Field of Classification Search
None
See application file for complete search history.

(56) References Cited

U.S. PATENT DOCUMENTS 11,043,790 B2 * 6/2021 Tokuda ................ H01S 5/0286
2006/0291246 A1 12/2006 Hattori et al.

FOREIGN PATENT DOCUMENTS

| JP | 2004-031900 A | 1/2004 | |
| JP | 2014-103160 A | 6/2014 | |
| JP | 2017117880 A * | 6/2017 | ... H01L 2224/16225 |
| WO | 2011/132350 A1 | 10/2011 | |
| WO | 2018/200863 A1 | 11/2018 | |

OTHER PUBLICATIONS

JP 2017117880 A, English translation (Year: 2017).*

* cited by examiner

*Primary Examiner* — Mukundbhai G Patel
(74) *Attorney, Agent, or Firm* — Volpe Koenig

(57) ABSTRACT

An optical element mounting package includes a recess, a mounting portion for an optical element, and a reflector. The mounting portion is at a bottom surface of the recess. The reflector is, in the recess, positioned forward in an emission direction of light of the optical element. A first portion is a portion of an inner side surface of the recess, and is positioned in an opposite direction to the emission direction. The first portion has an inclined surface toward the bottom surface of the recess.

19 Claims, 3 Drawing Sheets

OPTICAL ELEMENT MOUNTING PACKAGE, ELECTRONIC DEVICE, AND ELECTRONIC MODULE

TECHNICAL FIELD

The present invention relates to an optical element mounting package, an electronic device, and an electronic module.

BACKGROUND

There has been known a TO (Transistor Outline)—Can semiconductor laser where a laser chip is mounted (JP 2004-031900 A).

SUMMARY

An optical element mounting package of the present disclosure includes:
a recess;
a mounting portion for an optical element at a bottom surface of the recess; and
a reflector in the recess, the reflector being positioned forward in an emission direction of light of the optical element,
wherein a first portion that is a portion of an inner side surface of the recess and is positioned in an opposite direction to the emission direction has an inclined surface toward the bottom surface of the recess.
An electronic device of the present disclosure includes:
the above optical element mounting package; and
an optical element mounted on the mounting portion.
An electronic module of the present disclosure includes:
the above electronic device; and
a module substrate on which the electronic device is mounted.

DETAILED DESCRIPTION

Hereinafter, embodiments of the present disclosure will be described in detail with reference to the drawings.

Figure 1:
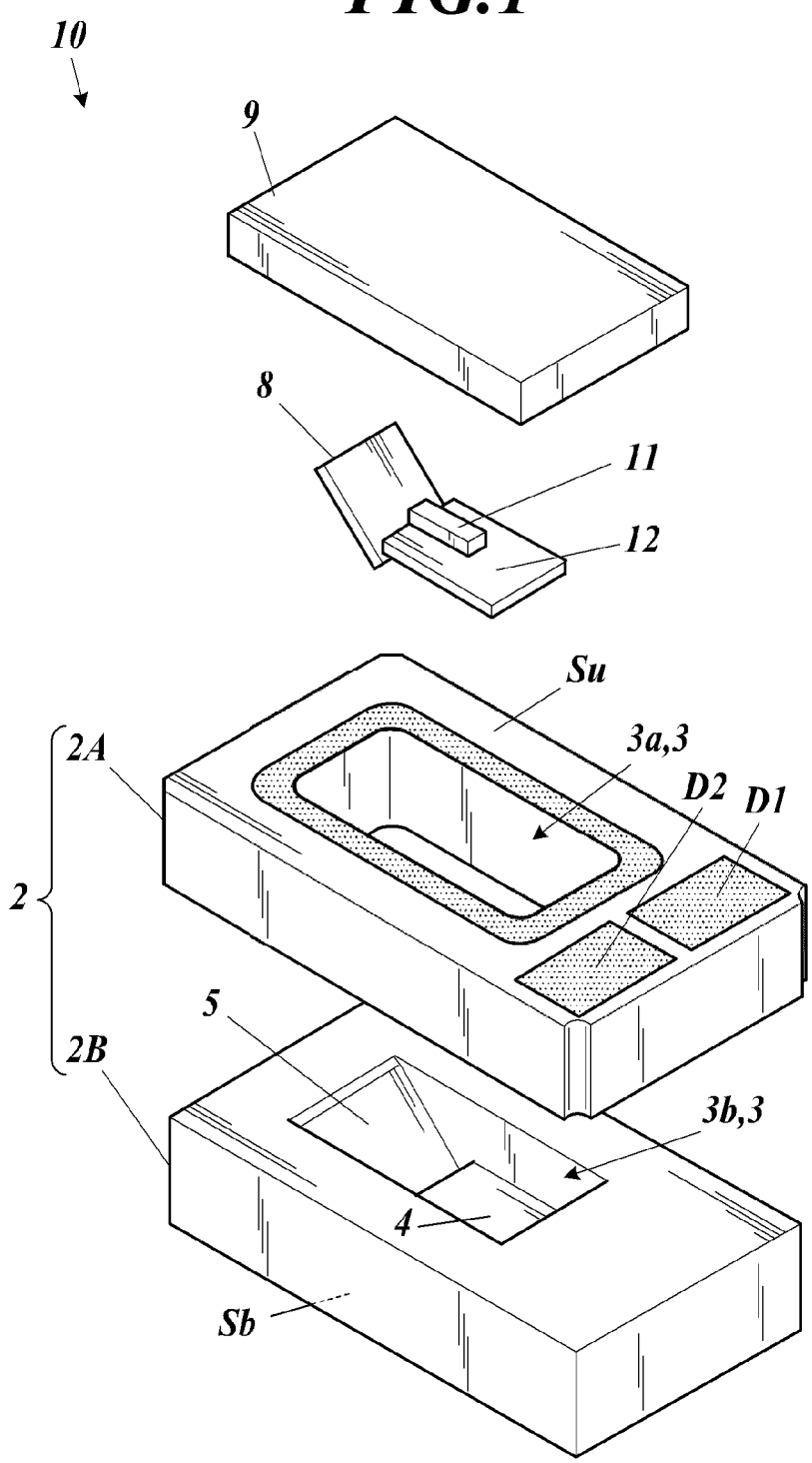
FIG. 1 is an exploded perspective view of an electronic device according to an embodiment of the present disclosure.
Figure 2:
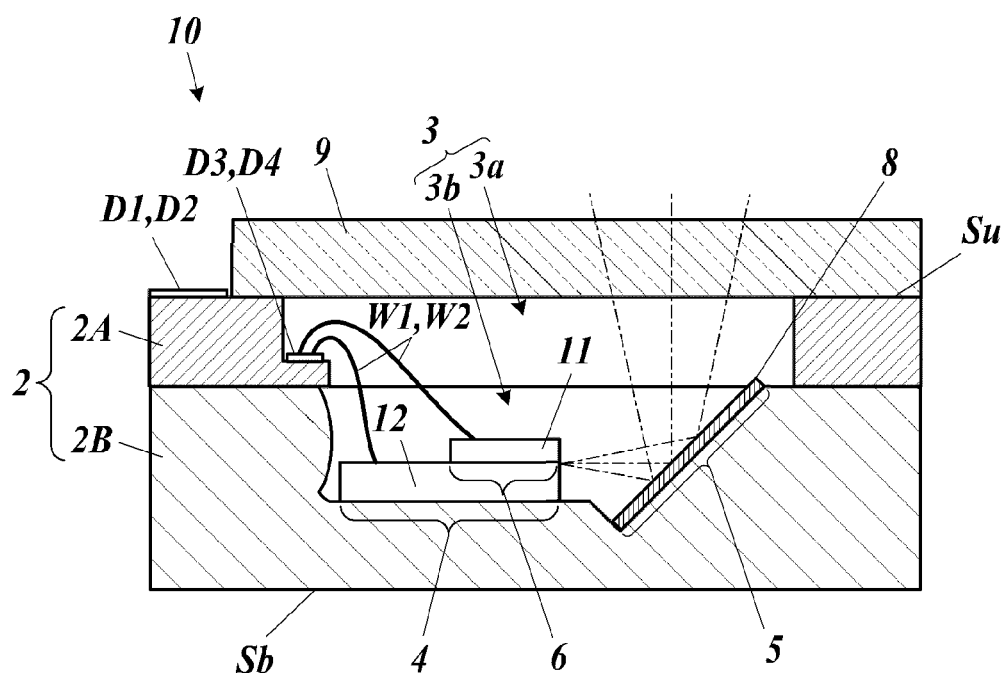
FIG. 2 is a vertical sectional view of the electronic device according to the embodiment of the present disclosure.
Figure 3:
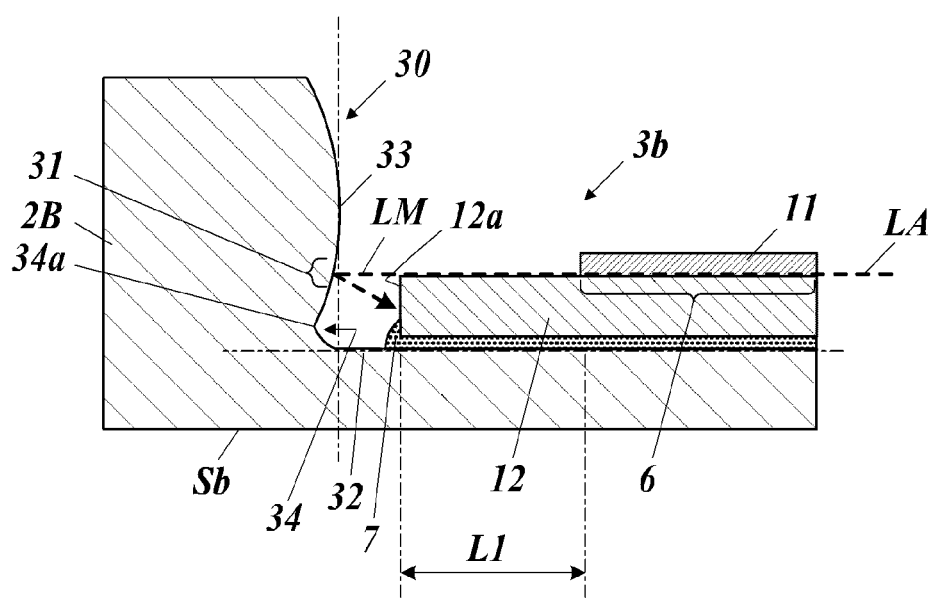
FIG. 3 shows details of part of FIG. 2

FIG. 1 is an exploded perspective view of an electronic device according to an embodiment of the present disclosure. FIG. 2 is a vertical sectional view of the electronic device according to the embodiment. FIG. 3 shows details of part of FIG. 2 (with bonding wires omitted). Hereinafter, description is made with a first surface Su side and a second surface Sb side of a base 2 regarded as upward and downward, respectively. However, directions of an electronic device 10 in use do not need to be the same as those in the description.

The electronic device 10 according to this embodiment includes: the base 2 having the first surface Su, the second surface Sb, and a recess 3 that is open in the first surface Su; an optical element 11 and an optical component 8 that are mounted in the recess 3; and a lid 9 with which the opening of the recess 3 is closed. The lid 9 is made of a material that transmits light (glass or resin), and is joined to the first surface Su of the base 2 with a joining material. The electronic device 10 excluding the lid 9, the optical element 11 and so forth corresponds to an optical element mounting package.

The base 2 has an upper base 2A mainly made of an insulating material and a lower base 2B made of a metal. The upper base 2A is provided with a through hole 3a passing therethrough in the up-down direction. The lower base 2B is provided with a concave part 3b communicating with the through hole 3a. The upper base 2A and the lower base 2B are joined, and when they are joined, the concave part 3b and the through hole 3a communicate, so that the recess 3, the upper side of which is open, is configured.

The basic shape part of the upper base 2A is made of, for example, a ceramic material, such as an aluminum oxide sintered body (alumina ceramic), an aluminum nitride sintered body, a mullite sintered body or a glass-ceramic sintered body. This part can be manufactured, for example, by molding ceramic green sheets of a pre-sintered ceramic material into a predetermined shape by punching or die machining, and sintering the ceramic green sheets. The upper base 2A further includes outer electrodes D1, D2 and inner electrodes D3, D4 (FIG. 1 and/or FIG. 2), and wiring conductors passing inside to connect the outer electrodes D1, D2 to the inner electrodes D3, D4. These conductors can be formed by applying conductive paste to predetermined points of the ceramic green sheets or filling predetermined points thereof with the conductive paste before sintering, and sintering the conductive paste together with the ceramic green sheets. Notches in corners of side surfaces of the upper base 2A may not be provided.

The lower base 2B is made of, for example, a metal material having a high thermal conductivity, such as copper or aluminum, and can be formed, for example, by stamping or the like. In the concave part 3b of the lower base 2B, a first mounting portion 4 where the optical element 11 is mounted through a submount 12 and a second mounting portion 5 where the optical component 8 is mounted are provided. The first mounting portion 4 is, for example, a planar surface extending in the horizontal direction. The "planar" surface means not only a completely flat surface but also a surface that can be regarded as a flat surface if small irregularities are neglected. The second mounting portion 5 is a planar surface inclined relative to the horizontal direction. The second mounting portion 5 is inclined in such a manner as to be at a higher position as it is away from the first mounting portion 4.

The optical element 11 is, for example, a laser diode (semiconductor laser). The optical element 11 may be any directional light-emitting element. The optical element 11 is joined to a mounting region 6 of the upper surface of the submount 12 with a joining material, and the submount 12 is joined to the upper side of the first mounting portion 4 with a joining material 7. The emission direction of light of the optical element 11 is a direction (e.g., horizontal direction) along the upper surface of the submount 12 toward the second mounting portion 5. The optical axis of the optical element 11 is indicated by LA in FIG. 3. The optical element 11 is electrically connected to the inner electrodes D3, D4 in the recess 3 of the upper base 2A through bonding wires W1, W2 and a wiring conductor(s) of the submount 12. The inner electrodes D3, D4 are connected to the outer electrodes D1, D2 outside the recess 3 through wiring conductors, and the optical element 11 is driven by power input through the outer electrodes D1, D2.

The optical component 8 is a flat mirror, and reflects, upward, incident/entering light emitted from the optical element 11. The reflected light goes above the electronic device 10 through the lid 9.

For example, the optical component 8 mounted on the second mounting portion 5 as described above provides a reflector in the recess 3 (3*b*), the reflector being positioned forward in the emission direction of light of the optical element 11. At the bottom surface 32 of the recess 3 (3*b*), the first mounting portion 4 for the optical element 11 is provided. On the first mounting portion 4, the submount 12 is disposed. The submount 12 has the mounting region 6 for the optical element 11 on a side closer to the reflector (8).

Due to characteristics of the optical element 11 as a laser diode (semiconductor laser), from the optical element 11, leakage light LM to the rear of the optical axis LA of the optical element 11 may be yielded as shown in FIG. 3.

The structure described below keeps the leakage light LM from being released outside.

As shown in FIG. 3, an inner side surface 30 of the recess 3 (3*b*) is positioned in the opposite direction to the emission direction of light of the optical element 11. A first portion 31 that is a portion of the inner side surface 30 has an inclined surface toward the bottom surface 32 of the recess 3 (3*b*).

The leakage light LM is reflected at the first portion 31 in such a manner as to travel toward the bottom surface 32. This keeps the leakage light LM from being reflected toward the opening (lid 9) of the recess 3 and reduces release of the leakage light LM to the outside of the electronic device 10, and consequently can keep the optical quality of the electronic device 10 excellent.

As shown in FIG. 3, the inclined surface, which the first portion 31 has, is a convex surface. This diffuses the leakage light LM reflected at the first portion 31 and lowers the light intensity, and consequently reduces release of the leakage light LM to the outside of the electronic device 10 caused by secondary reflection.

As shown in FIG. 3, the inner side surface 30, which includes the first portion 31, has a protrusion that protrudes toward the center of the recess 3 (3*b*). The apex 33 of the protrusion is positioned closer to the opening (lid 9) of the recess 3 (3*b*) than the first portion 31 is. This easily confines the leakage light LM in a small space below the apex 33 and reduces release of the leakage light LM to the outside of the electronic device 10.

As shown in FIG. 3, the inner side surface 30, which includes the first portion 31, has a depression 34 between the first portion 31 and the bottom surface 32 of the recess 3 (3*b*). The bottom 34*a* of the depression 34 is present between the first portion 31 and the bottom surface 32 of the recess 3. This makes the small space below the first portion 31 deep sideward, confines the leakage light LM therein, and easily attenuates the leakage light LM by repeating reflection, and consequently reduces release of the leakage light LM to the outside of the electronic device 10.

As shown in FIG. 3, the optical element mounting package has the submount 12 on the first mounting portion 4. The leakage light LM reflected at the first portion 31 in such a manner as to travel toward the bottom surface 32 is likely to hit the subomunt 12. This reduces release of the leakage light LM to the outside of the electronic device 10.

As shown in FIG. 3, the submount 12 has the mounting region 6 for the optical element 11 on the side closer to the reflector. The mounting region 6 for the optical element 11 is positioned a distance L1 away from the rear end 12*a* of the submount 12 toward the reflector, the rear end 12*a* facing the first portion 31, and the leakage light LM is likely to hit the submount 12. The leakage light LM is likely to be attenuated by hitting the insulating material (e.g., ceramic) of the submount 12 having a lower reflectance than that of the inner side surface 30 (e.g., copper/aluminum surface or a gold plating on the copper/aluminum surface) of the lower base 2B. This reduces release of the leakage light LM to the outside of the electronic device 10.

As shown in FIG. 3, a part of the joining material 7 that joins the submount 12 to the bottom surface 32 of the recess 3 is positioned from the submount 12 toward the first portion 31. Hence, the leakage light LM reflected at the first portion 31 is likely to hit the joining material 7 that protrudes from the rear end 12*a* of the submount 12. The leakage light LM is likely to be attenuated by hitting the joining material 7 (e.g., solder material) having a lower reflectance than that of the inner side surface 30 (e.g., copper/aluminum surface or a gold plating on the copper/aluminum surface) of the lower base 2B. This reduces release of the leakage light LM to the outside of the electronic device 10.

As described above, according to this embodiment, release of the leakage light LM to the outside of the electronic device 10 is reduced, so that the optical quality of the electronic device 10 can be kept excellent.

<Electronic Module>

Figure 4:
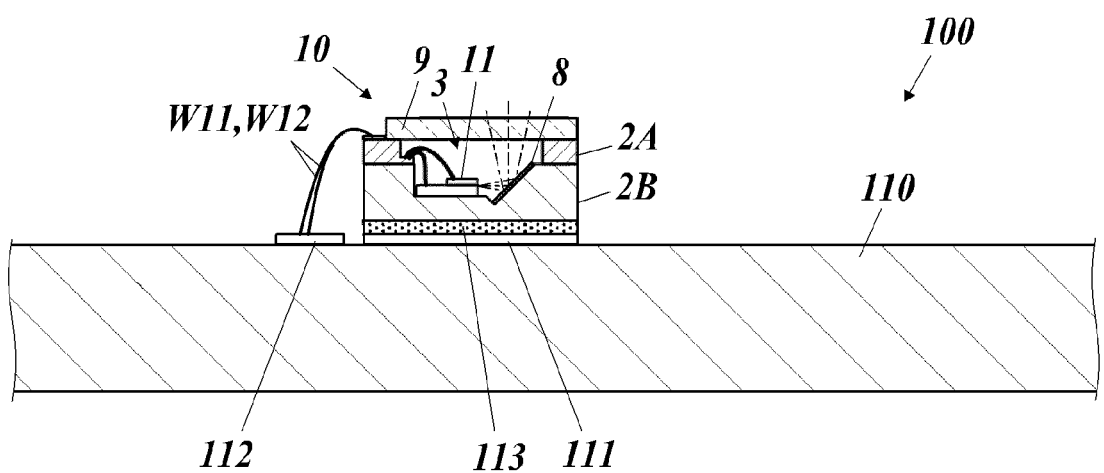
FIG. 4 is a vertical sectional view of an electronic module according to an embodiment of the present disclosure.

FIG. 4 is a vertical sectional view of an electronic module according to an embodiment of the present disclosure.

An electronic module 100 according to the embodiment of the present disclosure is configured by mounting the electronic device 10 on a module substrate 110. On the module substrate 110, in addition to the electronic device 10, an electronic device(s), an electronic element(s), an electric element(s) and/or the like may be mounted. On the module substrate 110, electrode pads 111, 112 are disposed, and the electronic device 10 is joined to the electrode pad 111 with a joining material 113, such as solder. The electronic module 100 may be configured such that the outer electrodes D1, D2 of the electronic device 10 are connected to two electrode pads 112 on the module substrate 110 through bonding wires W11, W12, respectively, and through these, signals are output from the module substrate 110 to the electronic device 10.

As described above, according to the electronic module 100 of this embodiment, light having required beam characteristics can be emitted in and from a small component space by the electronic device 10.

In the above, some embodiments of the present disclosure have been described. However, the present invention is not limited thereto. For example, details described and shown in the embodiments and the drawings, such as the materials, shapes, sizes and so forth of the parts of the base and the optical component, can be appropriately modified within a range not departing from the scope of the invention.

INDUSTRIAL APPLICABILITY

The present disclosure is applicable to an optical element mounting package, an electronic device and an electronic module.

REFERENCE SIGNS LIST

2 Base
2A Upper Base
2B Lower Base
3 Recess
3*a* Through Hole
3*b* Recess

6 Mounting Region
7 Joining Material
8 Optical Component
9 Lid
10 Electronic Device
11 Optical Element
12 Submount
30 Inner Side Surface
31 First Portion
32 Bottom Surface
33 Apex
34 Depression
34a Bottom of Depression
100 Electronic Module
110 Module Substrate
L1 Distance
LA Optical Axis
LM Leakage Light

The invention claimed is:

1. An optical element mounting package comprising:
a recess;
a mounting portion for an optical element at a bottom surface of the recess; and
a reflector in the recess, the reflector being positioned forward in an emission direction of light of the optical element,
wherein a first portion that is a portion of an inner side surface of the recess and is positioned in an opposite direction to the emission direction has an inclined surface toward the bottom surface of the recess, and
wherein the inclined surface is a convex surface.

2. The optical element mounting package according to claim 1,
wherein the inner side surface that includes the first portion has a protrusion that protrudes toward a center of the recess, and
wherein an apex of the protrusion is positioned closer to an opening of the recess than the first portion is.

3. The optical element mounting package according to claim 2, comprising a depression between the first portion and the bottom surface of the recess.

4. The optical element mounting package according to claim 3, comprising a submount on the mounting portion.

5. The optical element mounting package according to claim 2, comprising a submount on the mounting portion.

6. The optical element mounting package according to claim 1, comprising a depression between the first portion and the bottom surface of the recess.

7. The optical element mounting package according to claim 6, comprising a submount on the mounting portion.

8. The optical element mounting package according to claim 1, comprising a submount on the mounting portion.

9. The optical element mounting package according to claim 8, wherein the submount has a mounting region for the optical element on a side closer to the reflector.

10. The optical element mounting package according to claim 8, wherein a part of a joining material that joins the submount to the bottom surface of the recess is positioned from the submount toward the first portion.

11. An electronic device comprising:
the optical element mounting package according to claim 1; and
an optical element mounted on the mounting portion.

12. An electronic module comprising:
the electronic device according to claim 11; and
a module substrate on which the electronic device is mounted.

13. The optical element mounting package according to claim 1,
wherein the inner side surface that includes the first portion has a protrusion that protrudes toward a center of the recess, and
wherein an apex of the protrusion is positioned closer to an opening of the recess than the first portion is.

14. The optical element mounting package according to claim 13, comprising a submount on the mounting portion.

15. The optical element mounting package according to claim 13, comprising a depression between the first portion and the bottom surface of the recess.

16. The optical element mounting package according to claim 1, comprising a submount on the mounting portion.

17. The optical element mounting package according to claim 1, comprising a depression between the first portion and the bottom surface of the recess.

18. The optical element mounting package according to claim 17, comprising a submount on the mounting portion.

19. The optical element mounting package according to claim 15, comprising a submount on the mounting portion.

* * * * *